US012751160B2

(12) United States Patent
Kim et al.

(10) Patent No.: US 12,751,160 B2
(45) Date of Patent: Sep. 29, 2026

(54) DISPLAY DEVICE

(71) Applicant: Samsung Display Co., LTD., Yongin-si (KR)

(72) Inventors: Yeongho Kim, Yongin-si (KR); Ki-Tae Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 402 days.

(21) Appl. No.: 18/232,770

(22) Filed: Aug. 10, 2023

(65) Prior Publication Data

US 2024/0122004 A1 Apr. 11, 2024

(30) Foreign Application Priority Data

Oct. 7, 2022 (KR) ........................ 10-2022-0128857

(51) Int. Cl.

| | |
|---|---|
| ***H10K 59/131*** | (2023.01) |
| ***G06F 3/041*** | (2006.01) |
| ***H10K 59/124*** | (2023.01) |
| ***H10K 59/40*** | (2023.01) |
| *H10K 59/90* | (2023.01) |
| *H10W 72/30* | (2026.01) |
| *H10W 72/90* | (2026.01) |
| *H10W 90/00* | (2026.01) |

(52) U.S. Cl.

CPC ......... *H10K 59/131* (2023.02); *G06F 3/0412* (2013.01); *H10K 59/124* (2023.02); *H10K 59/40* (2023.02); *H10K 59/90* (2023.02); *H10W 72/342* (2026.01); *H10W 72/344* (2026.01); *H10W 72/354* (2026.01); *H10W 72/90* (2026.01); *H10W 72/923* (2026.01); *H10W 72/9415* (2026.01); *H10W 72/942* (2026.01); *H10W 72/9445* (2026.01); *H10W 90/732* (2026.01)

(58) Field of Classification Search

None

See application file for complete search history.

(56) References Cited

U.S. PATENT DOCUMENTS

| | | | | |
|---|---|---|---|---|
| 2019/0163304 | A1 | 5/2019 | Shim et al. | |
| 2019/0393440 | A1* | 12/2019 | Xin | H10K 59/131 |
| 2020/0303664 | A1 | 9/2020 | Choi et al. | |

FOREIGN PATENT DOCUMENTS

| | | | |
|---|---|---|---|
| KR | 10-1837625 | A | 3/2018 |
| KR | 10-1833235 | A | 4/2018 |
| KR | 10-2019-0064710 | A | 6/2019 |
| KR | 10-2020-0113048 | A | 10/2020 |

OTHER PUBLICATIONS

Korean Office Action corresponding to KR Application No. KR 10-2022-0128857, dated May 27, 2026 (13 pages).

* cited by examiner

*Primary Examiner* — Kyoung Lee

(74) *Attorney, Agent, or Firm* — Womble Bond Dickinson (US) LLP

(57) ABSTRACT

A display device includes: a substrate including: a display area; and a pad area including: an input pad area; an output pad area spaced apart from the input pad area in a first direction, and an intermediate area between the input pad area and the output pad area; and inorganic insulating layers defining a cutout portion in the intermediate area.

19 Claims, 6 Drawing Sheets

DISPLAY DEVICE

CROSS-REFERENCE TO RELATED APPLICATION(S)

The present application claims priority to and the benefit of Korean Patent Application No. 10-2022-0128857, filed on Oct. 7, 2022, the entire content of which is incorporated herein by reference.

BACKGROUND

1. Field

Aspects of some embodiments relate to a display device.

2. Description of the Related Art

The display device is a device that displays images for providing visual information to users. Among display devices, an organic light emitting diode display has recently attracted attention.

Organic light emitting displays have their own light-emitting properties and, unlike liquid crystal display devices, do not require a separate light source, so thickness and weight can be relatively reduced. In addition, organic light emitting display devices generally exhibit relatively high-quality characteristics such as relatively low power consumption, high luminance, and high reaction speed.

The above information disclosed in this Background section is only for enhancement of understanding of the background and therefore the information discussed in this Background section does not necessarily constitute prior art.

SUMMARY

Aspects of some embodiments relate to a display device. For example, aspects of some embodiments relate to a display device capable of providing visual information.

Aspects of some embodiments include a display device having relatively improved display quality.

A display device according to some embodiments may include a substrate including a display area and a pad area including an input pad area, an output pad area spaced apart from the input pad area in a first direction, and an intermediate area between the input pad area and the output pad area, and inorganic insulating layers defining a cutout portion in the intermediate area.

According to some embodiments, the cutout portion may include a first cutout portion near the input pad area and a second cutout portion near the output pad area.

According to some embodiments, the inorganic insulating layers may include a gate insulating layer on the substrate, a first interlayer insulating layer on the gate insulating layer, a first touch insulating layer on the gate insulating layer, and a second touch insulating layer on the first touch insulation layer.

According to some embodiments, the cutout portion may be obtained by removing the second touch insulating layer to an upper part of the substrate.

According to some embodiments, the display device may further include a second interlayer insulating layer between the first interlayer insulating layer and the first touch insulating layer.

According to some embodiments, the display device may further include a passivation layer between the first interlayer insulating layer and the first touch insulating layer.

According to some embodiments, the cutout portion may extend in a second direction crossing the first direction.

According to some embodiments, the cutout portion may have a trapezoidal shape in cross-sectional view.

According to some embodiments, the display device may further include a bending area between the display area and the output pad area and bent around a bending axis.

According to some embodiments, the display area may include a light emitting element on the substrate, an encapsulation layer located on the light emitting element, a first touch insulating layer located on the encapsulation layer, a touch layer on the first touch insulating layer, and a second touch insulating layer on the touch layer.

According to some embodiments, the touch layer may include a plurality of touch electrodes.

According to some embodiments, the display device may further include a gate insulating layer on the substrate, a first interlayer insulating layer on the gate insulating layer, a passivation layer on the first interlayer insulating layer, and a via insulating layer between the passivation layer and the light emitting element.

According to some embodiments, the display device may further include a second interlayer insulating layer between the first interlayer insulating layer and the passivation layer.

A display device according to some embodiments may include a substrate including a display area and a pad area including an input pad area, an output pad area spaced apart from the input pad area in a first direction, and an intermediate area between the input pad area and the output pad area, a gate insulating layer on the substrate in the input pad area, the output pad area, and the intermediate area, a first pad electrode on the gate insulating layer in the input pad area and the output pad area, a first interlayer insulating layer covering both sides of the first pad electrode and exposing a central portion of the first pad electrode on the gate insulating layer in the input pad area and the output pad area, and on the gate insulating layer in the intermediate area, a second pad electrode connected to the central portion of the first pad electrode and on the first interlayer insulating layer in the input pad area and the output pad area, a first touch insulating layer covering both sides of the second pad electrode and exposing a central portion of the second pad electrode on the first interlayer insulating layer in the input pad area and the output pad area, and on the first interlayer insulating layer in the intermediate area, and a second touch insulating layer covering both sides of the second pad electrode and exposing a central portion of the second pad electrode on the first touch insulating layer in the input pad area and the output pad area, and on the first touch insulating layer in the intermediate area, and a cutout portion removed from the second touch insulating layer to an upper part of the substrate is defined.

According to some embodiments, the cutout portion may include a first cutout portion near the input pad area and a second cutout portion near the output pad area.

According to some embodiments, the display device may further include a second interlayer insulating layer between the first interlayer insulating layer and the first touch insulating layer, covering both sides of the first pad electrode, and exposing the central portion of the first pad electrode in the input pad area and the output pad area, and between the first interlayer insulating layer and the first touch insulating layer in the intermediate area.

According to some embodiments, the display device may further include a passivation layer between the second interlayer insulating layer and the first touch insulating layer, covering both sides of the second pad electrode, and exposing the central portion of the second pad electrode in the input pad area and the output pad area, and between the second interlayer insulating layer and the first touch insulating layer in the intermediate area.

According to some embodiments, the display device may further include a third pad electrode connected to the central portion of the second pad electrode, and on the second touch insulating layer in the input pad area and the output pad area.

According to some embodiments, the cutout portion may extend in a second direction crossing the first direction.

According to some embodiments, the cutout portion may have a trapezoidal shape in cross-sectional view.

A display device according to some embodiments may include a substrate including a display area and a pad area including an input pad area, an output pad area spaced apart from the input pad area in a first direction, and an intermediate area between the input pad area and the output pad area, and inorganic insulating layers defining a cutout portion in the intermediate area. Accordingly, even if an organic layer is present between the input pad and the output pad, propagation of cracks may be blocked (e.g., prevented from forming) or reduced. Accordingly, it may be possible to prevent short circuits and corrosion in the pad area.

BRIEF DESCRIPTION OF THE DRAWINGS

Illustrative, non-limiting embodiments will be more clearly understood from the following detailed description in conjunction with the accompanying drawings.

DETAILED DESCRIPTION

Figure 1:
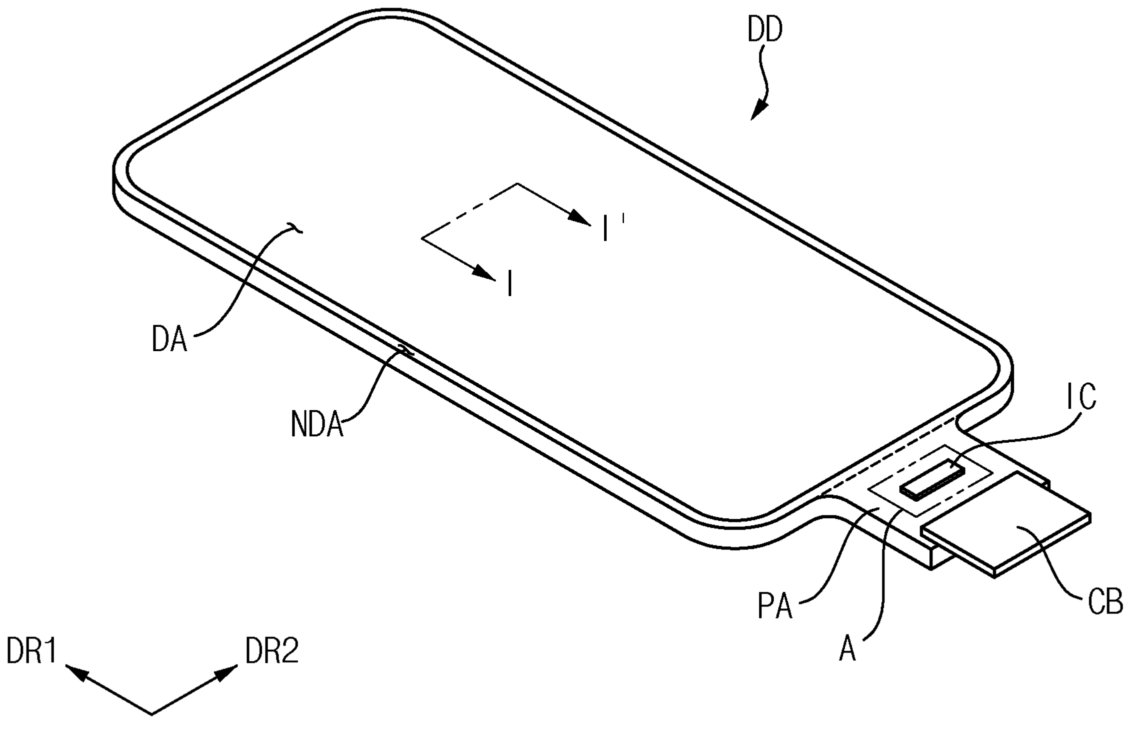
FIG. 1 is a plan view illustrating a display device according to some embodiments.

Hereinafter, display devices in according to some embodiments will be described in more detail with reference to the accompanying drawings. The same reference numerals are used for the same components in the drawings, and redundant descriptions of the same components will be omitted.

Figure 2:
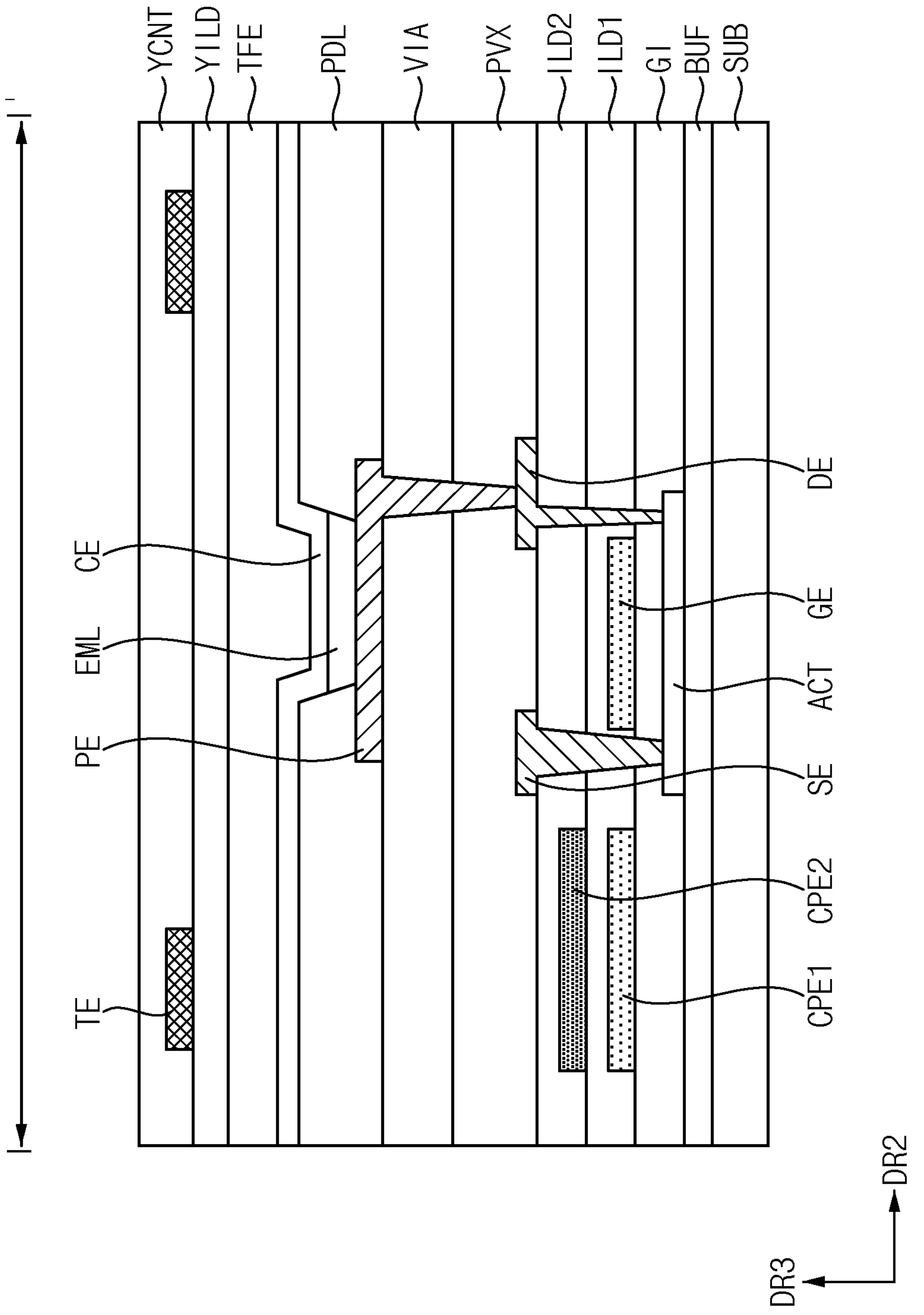
FIG. 2 is a cross-sectional view taken along the line of FIG. 1.

FIG. 1 is a plan view illustrating a display device according to some embodiments. FIG. 2 is a cross-sectional view taken along the line of FIG. 1.

Referring to FIG. 1, a display device DD may include a display area DA and a non-display area NDA. The display area DA may be defined as an area configured to emit light, and the non-display area NDA may be defined as an area at which components for transmitting signals to the display area DA are located, and which is not configured to emit light.

A plurality of pixels may be located in the display area DA on the substrate (e.g., the substrate SUB of FIG. 2). The plurality of pixels may emit light based on a signal transmitted from the non-display area NDA. The plurality of pixels may be generally located in the display area DA. Accordingly, the display area DA may be configured to emit light from the entire area to display images.

The non-display area NDA on the substrate may be located around (e.g., in a periphery or outside a footprint of) the display area DA. The non-display area NDA may include a pad area PA, a driving chip IC, a circuit board CB, and a plurality of driving units. The plurality of driving units may generate and transmit signals for driving the plurality of pixels, such as a gate signal, a light emitting signal, a data signal, a power supply voltage, and an initialization voltage.

Referring to FIGS. 1 and 2, the display area DA of the display device DD according to some embodiments may include a substrate SUB, a buffer layer BUF, a gate insulating layer GI, a first interlayer insulating layer ILD1, a second interlayer insulating layer ILD2, a passivation layer PVX, a via insulating layer VIA, a pixel defining layer PDL, an encapsulation layer TFE, a first touch insulating layer YILD, a second touch insulating layer YCNT, an active layer ACT, a gate electrode GE, a source electrode SE, a drain electrode DE, a first capacitor electrode CPE1, a second capacitor electrode CPE2, a pixel electrode PE, a common electrode CE, a light emitting layer EML, a touch layer, and a plurality of touch electrodes TE. Although various layers and components are illustrated and described with respect to FIGS. 1 and 2, embodiments according to the present disclosure are not limited thereto. For example, according to some embodiments, the display device DD may include additional layers or components or fewer layers or components without departing from the spirit and scope of embodiments according to the present disclosure.

A substrate SUB may include a display area DA and a non-display area NDA (for example, as shown in FIG. 1). The substrate SUB may include a transparent material or an opaque material. The substrate SUB may be formed of a transparent resin substrate. Examples of the transparent resin substrate may include a polyimide substrate. In this case, the polyimide substrate may include a first organic layer, a first barrier layer, a second organic layer, and the like.

A buffer layer BUF may be located on the substrate SUB. The buffer layer BUF may prevent or reduce instances of metal atoms, contaminants, or impurities diffusing from the substrate SUB into the active layer ACT. In addition, the buffer layer BUF may improve the flatness of the surface of the substrate SUB when the surface of the substrate SUB is not uniform. For example, the buffer layer BUF may include an inorganic material such as silicon oxide, silicon nitride, or silicon oxynitride. These materials may be used alone or in combination with each other.

An active layer ACT may be located on the buffer layer BUF. The active layer ACT may include a metal oxide semiconductor, an inorganic semiconductor (e.g., amorphous silicon, polysilicon), or an organic semiconductor. The active layer ACT may include a source region, a drain region, and a channel region located between the source region and the drain region.

The metal oxide semiconductor may include a binary compound ($AB_x$), a ternary compound ($AB_xC_y$), a quaternary compound ($AB_xC_y$), and the like including, for example, indium (In), gallium (Ga), tin (Sn), titanium (Ti), aluminum (Al), hafnium (Hf), zirconium (Zr), magnesium (Mg). For example, the metal oxide semiconductor may include zinc oxide ($ZnO_x$), gallium oxide ($GaO_x$), tin oxide ($SnO_x$), indium oxide ($InO_x$), indium gallium oxide (IGO), indium zinc oxide (IZO), indium tin oxide (ITO), indium zinc tin oxide (IZTO), indium gallium zinc oxide (IGZO), and the like. These materials may be used alone or in combination with each other.

A gate insulating layer GI may be located on the buffer layer BUF. The gate insulating layer GI may sufficiently cover the active layer ACT, and may have a substantially flat upper surface without generating a step around the active layer ACT. Optionally, the gate insulating layer GI may cover the active layer ACT and may be arranged along a profile of the active layer ACT. For example, the gate insulating layer GI may include an inorganic material such as silicon oxide ($SiO_x$), silicon nitride ($SiN_x$), silicon carbide ($SiC_x$), silicon oxynitride ($SiO_xN_y$), silicon oxycarbide ($SiO_xC_y$), and the like. These materials may be used alone or in combination with each other.

A first capacitor electrode CPE1 and a gate electrode GE may be located on the gate insulating layer GI. The gate electrode GE may overlap at least the channel region of the active layer ACT. The active layer ACT may be activated based on a signal or voltage applied to the gate electrode GE. The first capacitor electrode CPE1 may constitute or form a capacitor together with a second capacitor electrode CPE2 to be described later.

The gate electrode GE and the first capacitor electrode CPE1 may include a conductive material such as, for example, a metal, an alloy metal nitride, a conductive metal oxide, a transparent conductive material, and the like. Examples of the metal may include silver (Ag), molybdenum (Mo), aluminum (Al), tungsten (W), copper (Cu), nickel (Ni), chromium (Cr), titanium (Ti), tantalum (Ta), platinum (Pt), and scandium (Sc), but embodiments according to the present disclosure are not limited thereto, and any suitable metal or conductive material may be utilized. Examples of the conductive metal oxide may include Indium tin oxide, indium zinc oxide, and the like. In addition, examples of the metal nitride may include aluminum nitride ($AlN_x$), tungsten nitride ($WN_x$), chromium nitride ($CrN_x$), and the like, but embodiments according to the present disclosure are not limited thereto. The gate electrode GE and the first capacitor electrode CPE1 may be formed through the same process and may include the same material(s).

The first interlayer insulating layer ILD1 may be located on the gate insulating layer GI. The first interlayer insulating layer ILD1 may sufficiently cover the gate electrode GE, and may have a substantially flat upper surface without generating a step around the gate electrode GE. Optionally, the first interlayer insulating layer ILD1 may cover the gate electrode GE and may be arranged along a profile of the gate electrode GE.

For example, the first interlayer insulating layer ILD1 may include inorganic materials such as silicon oxide, silicon nitride, silicon carbide, silicon oxynitride, silicon oxycarbide, and the like. These materials may be used alone or in combination with each other.

A second capacitor electrode CPE2 may be located on the first interlayer insulating layer ILD1. The second capacitor electrode CPE2 may be arranged to overlap the first capacitor electrode CPE1. The first capacitor electrode CPE1 and the second capacitor electrode CPE2 may collectively constitute the capacitor.

The second capacitor electrode CPE2 may include conduct material such as, a metal, an alloy metal nitride, a conductive metal oxide, a transparent conductive material, and the like. Examples of the metal may include silver (Ag), molybdenum (Mo), aluminum (Al), tungsten (W), copper (Cu), nickel (Ni), chromium (Cr), titanium (Ti), tantalum (Ta), platinum (Pt), and scandium (Sc), and the like, but embodiments according to the present disclosure are not limited thereto, and any suitable metal or conductive material may be utilized. Examples of the conductive metal oxide may include Indium tin oxide, indium zinc oxide, and the like. Also, examples of the metal nitride may include aluminum nitride ($AlN_x$), tungsten nitride ($WN_x$), chromium nitride ($CrN_x$), and the like, but embodiments according to the present disclosure are not limited thereto, and any suitable metal or conductive material may be utilized.

A second interlayer insulating layer ILD2 may be located on the first interlayer insulating layer ILD1. The second interlayer insulating layer ILD2 may sufficiently cover the second capacitor electrode CPE2, and may have a substantially flat upper surface without generating a step around the second capacitor electrode CPE2. Optionally, the second interlayer insulating layer ILD2 may cover the second capacitor electrode CPE2 and can be arranged along the profile of the second capacitor electrode CPE2.

For example, the second interlayer insulating layer ILD2 may include inorganic materials such as silicon oxide, silicon nitride, silicon carbide, silicon oxynitride, silicon oxycarbide, and the like. These materials may be used alone or in combination with each other.

A source electrode SE may be located on the second interlayer insulating layer ILD2. The source electrode SE may be connected to the source region of the active layer ACT through a contact hole penetrating the gate insulating layer GI, the first interlayer insulating layer ILD1, and the second interlayer insulating layer ILD2.

A drain electrode DE may be located on the second interlayer insulating layer ILD2. The drain electrode DE may be connected to the drain region of the active layer ACT through a contact hole penetrating the gate insulating layer GI, the first interlayer insulating layer ILD1, and the second interlayer insulating layer ILD2.

For example, the source electrode SE may include a conductive material such as, for example, a metal, an alloy, a metal nitride, a conductive metal oxide, a transparent conductive material, and the like. These materials may be used alone or in combination with each other. The drain electrode DE and the source electrode SE may be formed through the same process and may include the same material.

A passivation layer PVX may be located on the second interlayer insulating layer ILD2. The passivation layer PVX may sufficiently cover the source electrode SE and the drain electrode DE. The passivation layer PVX may protect lower layers including the source electrode SE and the drain electrode DE. The passivation layer PVX may include an inorganic insulating material. Examples of materials that can be used as the passivation layer PVX may include silicon oxide ($SiO_x$), silicon nitride ($SiN_x$), silicon oxynitride (SiON), and the like. These materials may be used alone or in combination with each other.

A via insulating layer VIA may be located on the passivation layer PVX. The via insulating layer VIA may include an organic material. For example, the via insulating layer VIA may include organic materials such as phenolic resin, polyacrylate resin, polyimide resin, polyamide resin, siloxane resin, epoxy resin, and the like. These materials may be used alone or in combination with each other.

A pixel electrode PE may be located on the via insulating layer VIA. The pixel electrode PE may be connected to the drain electrode DE through a contact hole penetrating the via insulating layer VIA and the passivation layer PVX. The pixel electrode PE may include a metal, an alloy, a metal nitride, a conductive metal oxide, a transparent conductive material, and the like. These may be used alone or in combination with each other. According to some embodiments, the pixel electrode PE may have a stacked structure including ITO/Ag/ITO. The pixel electrode PE may operate as an anode.

A pixel defining layer PDL may be located on the via insulating layer VIA. The pixel defining layer PDL may cover both side portions of the pixel electrode PE. In addition, an opening exposing a portion of the upper surface of the pixel electrode PE may be defined in the pixel defining layer PDL.

For example, the pixel defining layer PDL may include an inorganic material or an organic material. According to some embodiments, the pixel defining layer PDL may include an organic material such as an epoxy resin, a siloxane resin, and the like. These materials may be used alone or in combination with each other. According to some embodiments, the pixel defining layer PDL may further include a light blocking material containing a black pigment, a black dye, or the like.

A light emitting layer EML may be located on the pixel electrode PE. The light emitting layer EML may include an organic material emitting light of a color (e.g., a set or predetermined color).

A common electrode CE may be located on the light emitting layer EML and the pixel defining layer PDL. The common electrode CE may include a metal, an alloy, a metal nitride, a conductive metal oxide, a transparent conductive material, and the like. These materials may be used alone or in combination with each other. The common electrode CE may operate as a cathode.

The pixel electrode PE, the light emitting layer EML, and the common electrode CE may constitute a light emitting element.

An encapsulation layer TFE may be located on the common electrode CE. The encapsulation layer TFE may prevent impurities and moisture from penetrating into the pixel electrode PE, the light emitting layer EML, and the common electrode CE from the outside. The encapsulation layer TFE may include at least one inorganic layer and at least one organic layer. For example, the inorganic layer may include silicon oxide, silicon nitride, silicon oxynitride, and the like. These materials may be used alone or in combination with each other. The organic layer may include a polymer cured product such as polyacrylate.

A first touch insulating layer YILD may be located on the encapsulation layer TFE. The first touch insulating layer YILD may include an inorganic insulating material. Examples of materials that can be used as the first touch insulating layer YILD may include silicon oxide ($SiO_x$), silicon nitride ($SiN_x$), silicon oxynitride (SiON), and the like. These materials may be used alone or in combination with each other.

A touch layer may be located on the first touch insulating layer YILD. The touch layer may include a plurality of touch electrodes TE. The plurality of touch electrodes TE may serve to sense an external touch and transmit a signal to the touch driver.

The touch layer may include a conductive material, such as a metal, an alloy, a metal oxide, a transparent conductive material, and the like. Examples of materials that can be used as the touch layer may include silver (Ag), an alloy containing silver, Molybdenum (Mo), an alloy containing molybdenum (Al), an alloy containing aluminum (Al), an aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium-tin oxide (ITO), indium-zinc oxide (IZO), and the like, but embodiments according to the present disclosure are not limited thereto, and any suitable conductive material may be utilized. These materials may be used alone or in combination with each other.

A second touch insulating layer YCNT may be located on the first touch insulating layer YILD to cover the touch layer. The second touch insulating layer YCNT may include an inorganic insulating material. Examples of the material that can be used as the second touch insulating layer YCNT may include silicon oxide ($SiO_x$), silicon nitride ($SiN_x$), silicon oxynitride (SiON), and the like. These materials may be used alone or in combination with each other.

Figure 3:
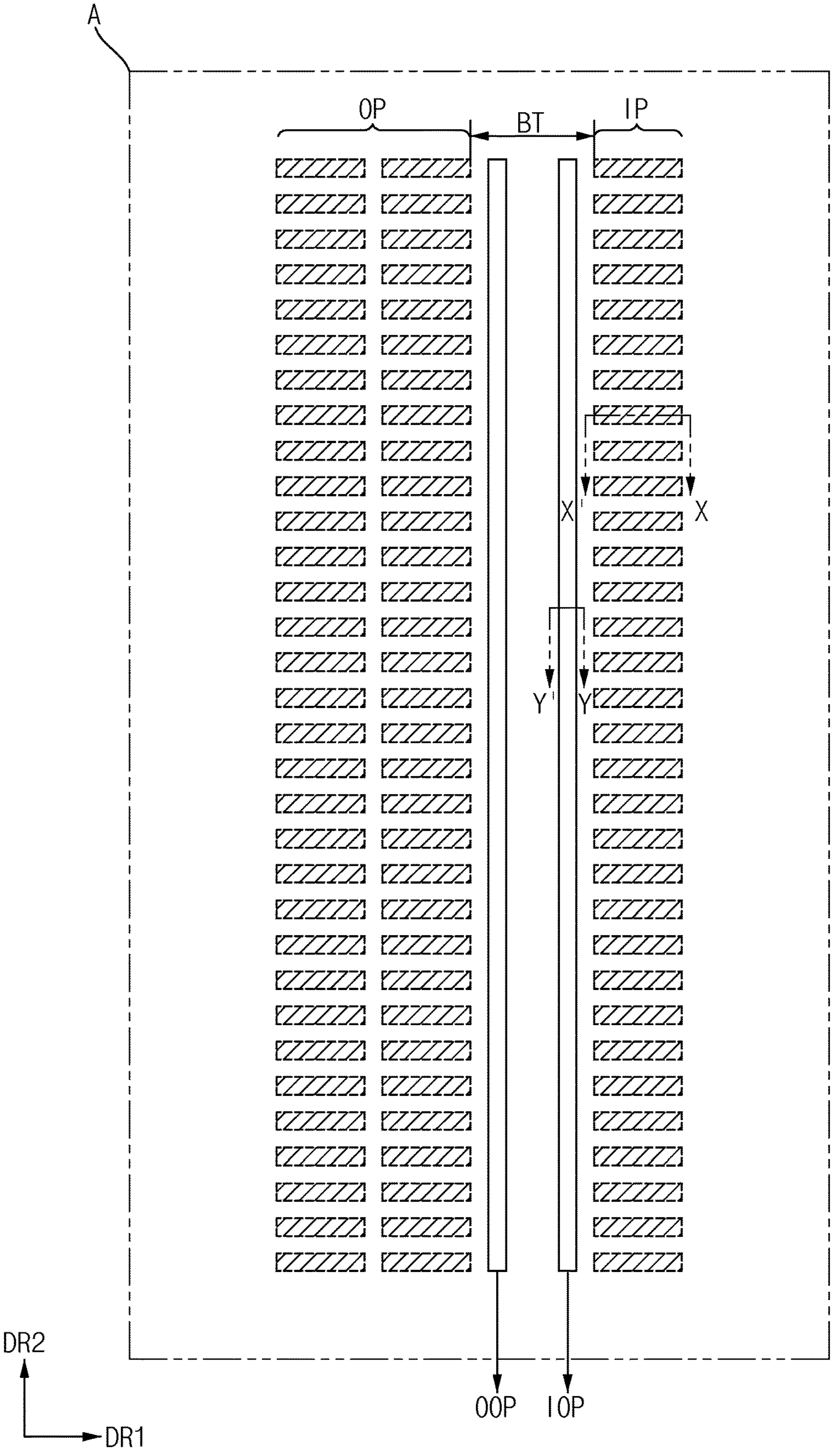
FIG. 3 is an enlarged plan view of an area A of FIG. 2.

FIG. 3 is an enlarged plan view of an area A of FIG. 2.

Referring to FIGS. 1 and 3, The non-display area NDA of the display device DD according to some embodiments may include an input pad area IP, an output pad area OP, an intermediate area BT, a first cutout portion IOP, a second cutout portion OOP, a driving chip IC, and a circuit board CB.

A plurality of input pads included in the input pad area IP may transmit a voltage, a control signal, and the like provided from the circuit board CB to the driving chip IC. That is, the voltage from the circuit board CB, the control signal, and the like may be provided to the driving chip IC through the plurality of input pads.

A plurality of output pads included in the output pad area OP may receive a voltage, a control signal, and the like provided from the driving chip IC. That is, the voltage, the control signal, and the like from the driving chip IC may be provided to a plurality of pixels, a scan driver, and a light emitting driver through the plurality of output pads.

The input pad area IP and the output pad area OP may be spaced apart from each other in the first direction DR1. The plurality of output pads may be arranged in two rows extending in the second direction DR2 in the output pad area OP. However, the present invention is not limited thereto, and the plurality of output pads may be arranged in three or more rows in the output pad area OP.

In addition, the plurality of input pads may be arranged in one row extending in the second direction DR2 in the input pad area IP. However, the present invention is not limited thereto, and the plurality of input pads may be arranged in two or more rows in the input pad area IP.

An intermediate area BT may be defined between the input pad area IP and the output pad area OP. The intermediate area BT may extend in the second direction DR2. The intermediate area BT may include a plurality of inspection pads, a first cutout portion IOP, and a second cutout portion OOP.

Figure 4:
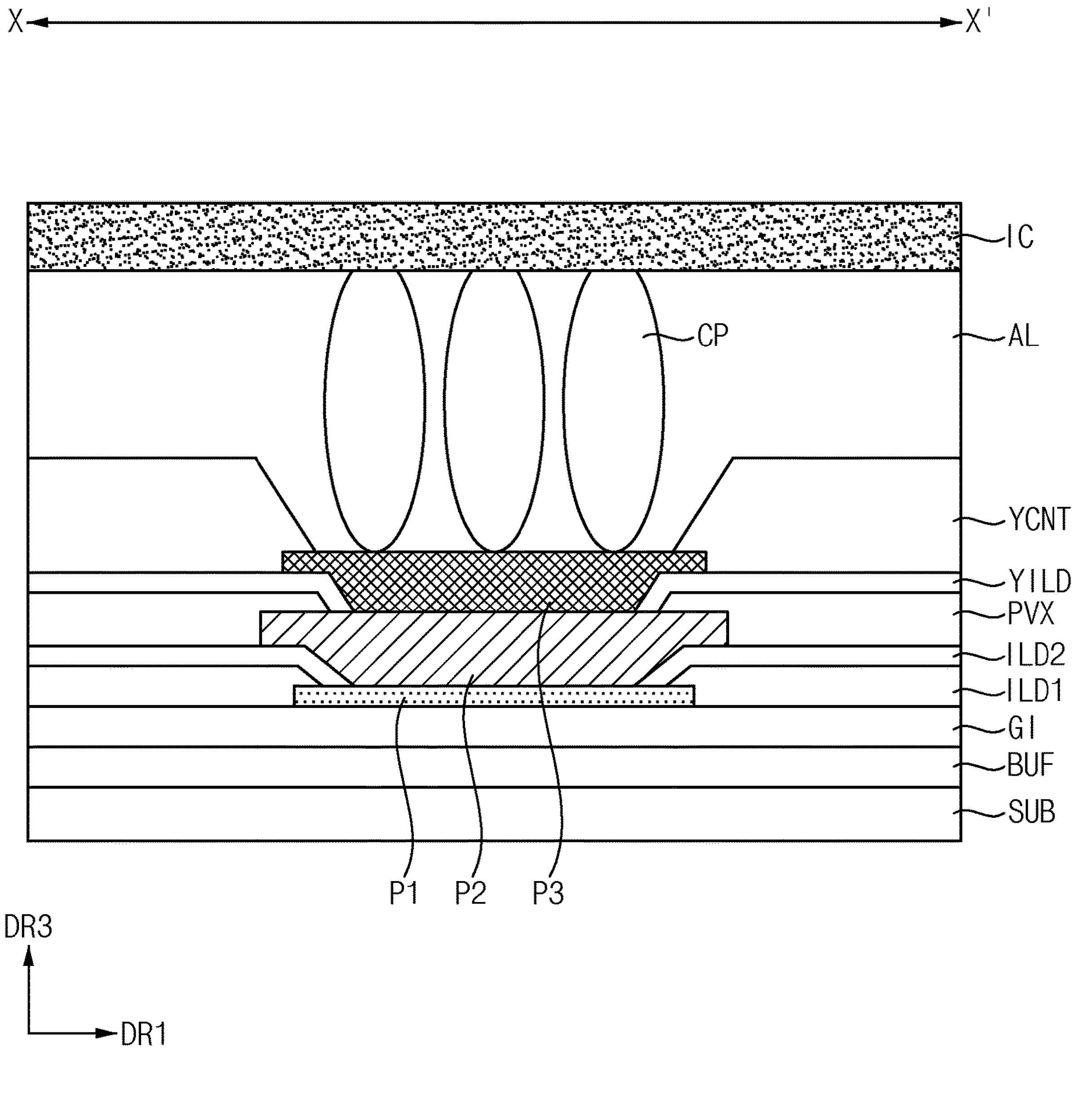
FIG. 4 is a cross-sectional view taken along the line X-X' of FIG. 3.

The plurality of inspection pads may inspect a voltage, a control signal, and the like passing through the input pad area IP and the output pad area OP. The plurality of inspection pads may be located between the first cutout portion IOP and the second cutout portion OOP. An organic layer may be arranged around the plurality of inspection pads. When a plurality of conduction particles CP of FIG. 4 are compressed on a third pad electrode P3 of FIG. 4, cracks may be formed. The crack may propagate along the organic layer.

The driving chip IC may be located in the pad area PA on the substrate (e.g., the substrate SUB of FIG. 4). The driving chip IC may control signals, voltages, and the like provided to the pixels PX. According to some embodiments, when the substrate includes a transparent resin substrate, the driving chip IC may have a chip on plastic (COP) structure directly located on the substrate.

However, embodiments according to the present invention are not limited thereto, and when the substrate includes glass, the driving chip IC may have a chip on glass (COG) structure directly located on the substrate. In addition, a flexible film may be located in the pad area PA on the substrate, and the driving chip IC may have a chip on film (COF) structure directly located on the flexible film.

FIG. 4 is a cross-sectional view taken along the line X-X' of FIG. 3

In describing the input pad area of FIG. 4, The components which are substantially the same as those described with reference to FIG. 2 are denoted by the same reference numerals, and a detailed description thereof may be omitted.

Referring to FIG. 4, the input pad area IP according to some embodiments may include the substrate SUB, the buffer layer BUF, the gate insulating layer GI, the first interlayer insulating layer ILD1, the second interlayer insulating layer ILD2, the passivation layer PVX, the first touch insulating layer YILD, the second touch insulating layer YCNT, an adhesion layer AL, a plurality of conduction particles CP, the driving chip IC, a first pad electrodes P1, a second pad electrodes P2, and a third pad electrodes P3.

A first pad electrode P1 may be located on the gate insulating layer GI. The first capacitor electrode CPE1 of FIG. 2, the gate electrode GE of FIG. 2, and the first pad electrode P1 may constitute a first conduction layer. The first capacitor electrode, the gate electrode, and the first pad electrode P1, constituting the first conduction layer, may be formed through the same process and may include the same material.

The first interlayer insulating layer ILD1 may be located on the gate insulating layer GI. The first interlayer insulating layer ILD1 may cover both sides of the first pad electrode P1 and expose the central portion of the first pad electrode P1.

The second interlayer insulating layer ILD2 may be located on the first interlayer insulating layer ILD1. The second interlayer insulating layer ILD2 may cover both sides of the first pad electrode P1 and expose the central portion of the first pad electrode P1.

A second pad electrode P2 may be located on the second interlayer insulating layer ILD2. The second pad electrode P2 may be connected to the central portion of the first pad electrode P1. According to some embodiments, the second interlayer insulating layer ILD2 may be omitted. That is, the second pad electrode P2 may be located on the first interlayer insulating layer ILD1.

The source electrode SE of FIG. 2, the drain electrode DE2 of FIG. 2, and the second pad electrode P2 may form a second conduction layer. The source electrode, the drain electrode, and the second pad electrode P2 constituting the second conduction layer may be formed through the same process, and may include the same material.

The passivation layer PVX may be formed on the second interlayer insulating layer ILD2. The passivation layer PVX may cover both sides of the second pad electrode P2 and expose the central portion of the second pad electrode P2.

The first touch insulating layer YILD may be located on the passivation layer PVX. The first touch insulating layer YILD may cover both sides of the second pad electrode P2 and expose the central portion of the second pad electrode P2.

A third pad electrode P3 may be located on the first touch insulating layer YILD. The third pad electrode P3 may be connected to the central portion of the second pad electrode P2. The plurality of touch electrodes TE and the third pad electrode P3 of FIG. 2 may constitute a third conduction layer. The touch electrodes and the third pad electrode P3 constituting the third conduction layer may be formed through the same process and may include the same material.

A second touch insulating layer YCNT may be located on the first touch insulating layer YILD. The second touch insulating layer YCNT may cover both sides of the third pad electrode P3 and expose the central portion of the third pad electrode P3.

An adhesion layer AL and a plurality of conduction particles CP may be located between the substrate SUB and the driving chip IC. The adhesion layer AL and the plurality of conduction particles CP may electrically connect the substrate SUB and the driving chip IC.

According to some embodiments, each of the plurality of conduction particles CP may include a core including an insulating polymer material and a conductive film surrounding the core and including a conductive metal material.

The adhesion layer AL may include an insulating polymer material. For example, the adhesion layer AL may include an insulating polymer material such as an epoxy resin, an acrylic resin, a phenol resin, a melamine resin, a diallyl phthalate resin, a urea resin, a polyimide resin, a polystyrene resin, a polyurethane resin, a polyethylene resin, a polyvinyl acetate resin, and the like. These materials may be used alone or in combination with each other.

FIG. 4 is a diagram illustrating an input pad area IP, but the output pad area OP may also be configured to be substantially the same as the input pad area IP.

Figure 5:
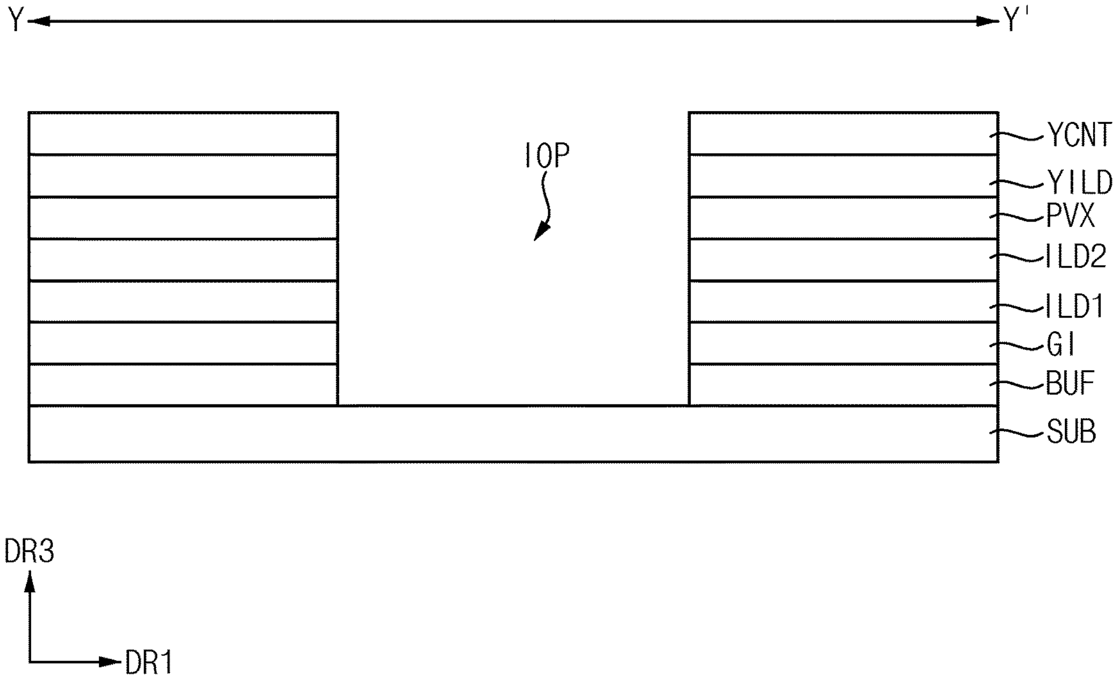
FIGS. 5 and 6 are diagrams for describing a cutout portion according to some embodiments.
Figure 6:
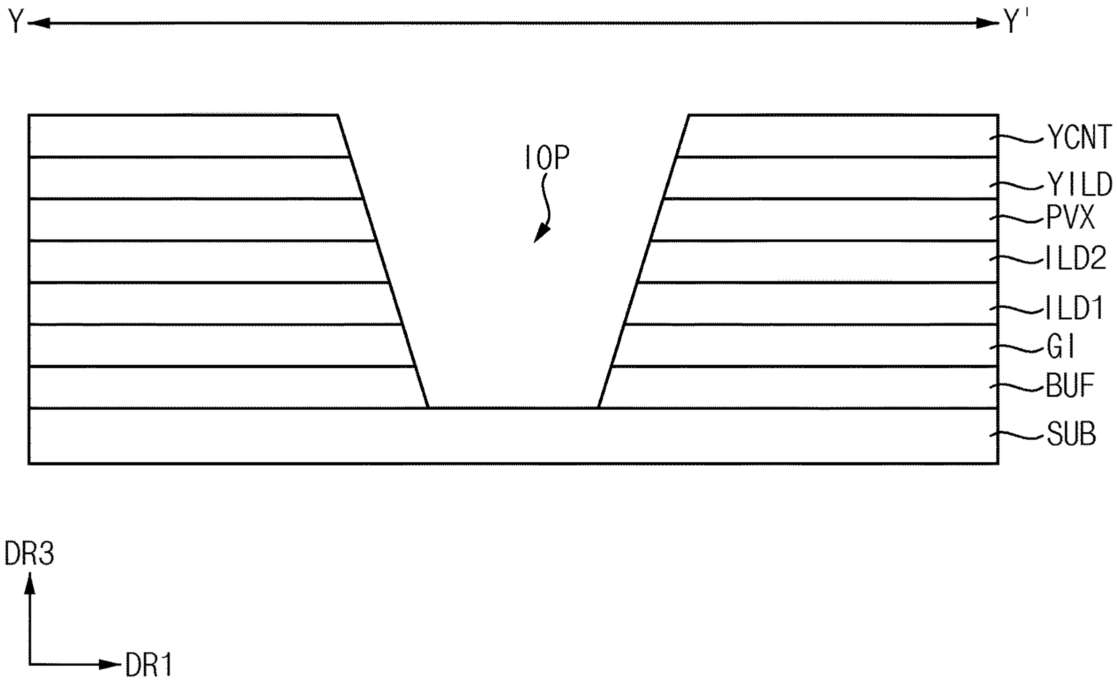

FIGS. 5 and 6 are diagrams for describing a cutout portion according to some embodiments.

In describing the intermediate area of FIGS. 5 and 6, the components which are substantially the same as those described with reference to FIG. 2 are denoted by the same reference numerals, and a detailed description thereof may be omitted.

Referring to FIGS. 3, 5, and 6, the intermediate area BT according to some embodiments may include the substrate SUB and inorganic insulating layers. In this case, the inorganic insulating layers may include the buffer layer BUF, the gate insulating layer GI, the first interlayer insulating layer ILD1, the second interlayer insulating layer ILD2, the passivation layer PVX, the first touch insulating layer YILD, the second touch insulating layer YCNT, the first cutout portion IOP, and the second cutout portion OOP. The inorganic insulating layers on the substrate SUB may be partially omitted. For example, the second interlayer insulating layer ILD2 may be omitted. That is, the passivation layer PVX may be located on the first interlayer insulating layer ILD1.

The first cutout portion IOP may be formed by removing portions of the inorganic insulating layers near the input pad area IP of the intermediate area BT. According to some embodiments, the first cutout portion IOP may be formed by removing from the second touch insulating layer YCNT to the upper part of the substrate SUB.

Embodiments according to the present invention are not limited thereto, and the first cutout portion IOP may be formed by removing from an inorganic insulating layer located at the uppermost part of the inorganic insulating layers to the upper part of the substrate SUB.

According to some embodiments, the first cutout portion IOP may extend in the second direction DR2. According to some embodiments, the first cutout portion IOP may have a trapezoidal shape in cross-sectional view. FIG. 6 may illustrate that the first cutout portion IOP has the trapezoidal shape in which an upper side is longer than a lower side in cross-sectional view. However, the present invention is not limited thereto, and the first cutout portion IOP may have a trapezoidal shape in which the lower side is longer than the upper side in cross-sectional view.

The second cutout portion OOP may be formed by removing portions of the inorganic insulating layers near the output pad area OP of the intermediate area BT. According to some embodiments, the second cutout portion IOP may be formed by removing from the second touch insulating layer YCNT to the upper part of the substrate SUB.

Embodiments according to the present invention are not limited thereto, and the second cutout portion OOP may be formed by removing from an inorganic insulating layer located at the uppermost part of the inorganic insulating layers to the upper part of the substrate SUB.

According to some embodiments, the second cutout portion OOP may extend in the second direction DR2. According to some embodiments, the second cutout portion OOP may have a trapezoidal shape in cross-sectional view.

When the plurality of conduction particles are compressed on the third pad electrode, a crack may be formed. The crack may be propagated by the inorganic insulating layers to pass through the intermediate area BT including the organic layer. Accordingly, short and corrosion may occur in the input pad area IP and the output pad area OP. According to some embodiments of the present invention, when portions of the plurality of inorganic insulating layers are removed, the crack may not propagate. That is, by removing inorganic insulating layers, which are media for propagating the crack, short and corrosion phenomena that may occur in the input pad area IP and the output pad area OP may be fundamentally blocked.

Figure 7:
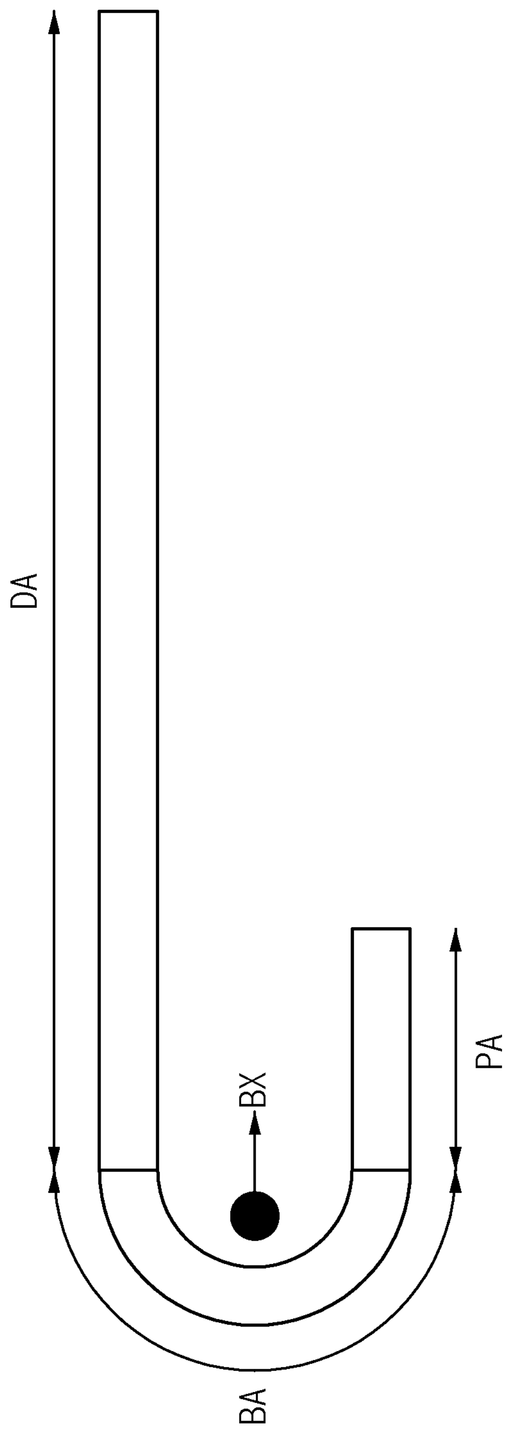
FIG. 7 is a plan view illustrating the display device according to some embodiments.

FIG. 7 is a plan view illustrating the display device according to some embodiments.

Referring to FIG. 7, The present invention may also be applied to a display device including a bending area BA bendable around a bending axis BX. That is, the display device may further include the bending area BA as well as the display area DA and the pad area PA described above. Accordingly, the display device according to some embodiments may include a flexible display device.

Embodiments according to the present disclosure can be applied to various display devices. For example, embodiments according to the present disclosure are applicable to various display devices such as display devices for vehicles, ships and aircraft, portable communication devices, display devices for exhibition or information transmission, medical display devices, and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims, and their equivalents.

What is claimed is:

1. A display device comprising:
- a substrate comprising:
  - a display area; and
  - a pad area including:
    - an input pad area;
    - an output pad area spaced apart from the input pad area in a first direction, and
    - an intermediate area between the input pad area and the output pad area; and
- inorganic insulating layers defining a cutout portion in the intermediate area,
- wherein the cutout portion includes a first cutout portion adjacent to the input pad area and a second cutout portion adjacent to the output pad area.

2. The display device of claim 1, wherein the inorganic insulating layers include:
- a gate insulating layer on the substrate;
- a first interlayer insulating layer on the gate insulating layer;
- a first touch insulating layer on the gate insulating layer; and
- a second touch insulating layer on the first touch insulation layer.

3. The display device of claim 2, wherein the cutout portion is obtained by removing the second touch insulating layer to an upper part of the substrate.

4. The display device of claim 2, further comprising a second interlayer insulating layer between the first interlayer insulating layer and the first touch insulating layer.

5. The display device of claim 2, further comprising a passivation layer between the first interlayer insulating layer and the first touch insulating layer.

6. The display device of claim 1, wherein the cutout portion extends in a second direction crossing the first direction.

7. The display device of claim 1, wherein the cutout portion has a trapezoidal shape in cross-sectional view.

8. The display device of claim 1, further comprising a bending area between the display area and the output pad area and bent around a bending axis.

9. The display device of claim 1, wherein the display area includes:
- a light emitting element on the substrate;
- an encapsulation layer on the light emitting element;
- a first touch insulating layer on the encapsulation layer;
- a touch layer on the first touch insulating layer; and
- a second touch insulating layer on the touch layer.

10. The display device of claim 9, wherein the touch layer includes a plurality of touch electrodes.

11. The display device of claim 9, further comprising:
- a gate insulating layer on the substrate;
- a first interlayer insulating layer on the gate insulating layer;
- a passivation layer on the first interlayer insulating layer; and
- a via insulating layer between the passivation layer and the light emitting element.

12. The display device of claim 11, further comprising a second interlayer insulating layer between the first interlayer insulating layer and the passivation layer.

13. A display device comprising:
- a substrate comprising:
  - a display area; and
  - a pad area including:
    - an input pad area;
    - an output pad area spaced apart from the input pad area in a first direction; and
    - an intermediate area between the input pad area and the output pad area;
- a gate insulating layer on the substrate in the input pad area, the output pad area, and the intermediate area;
- a first pad electrode on the gate insulating layer in the input pad area and the output pad area;
- a first interlayer insulating layer covering opposite sides of the first pad electrode and exposing a central portion of the first pad electrode on the gate insulating layer in the input pad area and the output pad area, and on the gate insulating layer in the intermediate area;

a second pad electrode connected to the central portion of the first pad electrode and on the first interlayer insulating layer in the input pad area and the output pad area;

a first touch insulating layer covering opposite sides of the second pad electrode and exposing a central portion of the second pad electrode on the first interlayer insulating layer in the input pad area and the output pad area, and on the first interlayer insulating layer in the intermediate area; and a second touch insulating layer covering the opposite sides of the second pad electrode and exposing a central portion of the second pad electrode on the first touch insulating layer in the input pad area and the output pad area, and on the first touch insulating layer in the intermediate area, and the second touch insulating layer having a portion removed to an upper part of the substrate to form a cutout portion.

14. The display device of claim 13, wherein the cutout portion includes a first cutout portion adjacent to the input pad area and a second cutout portion adjacent to the output pad area.

15. The display device of claim 13, further comprising a second interlayer insulating layer between the first interlayer insulating layer and the first touch insulating layer, covering opposite sides of the first pad electrode, and exposing the central portion of the first pad electrode in the input pad area and the output pad area, and between the first interlayer insulating layer and the first touch insulating layer in the intermediate area.

16. The display device of claim 15, further comprising a passivation layer between the second interlayer insulating layer and the first touch insulating layer, covering both sides of the second pad electrode, and exposing the central portion of the second pad electrode in the input pad area and the output pad area, and between the second interlayer insulating layer and the first touch insulating layer in the intermediate area.

17. The display device of claim 13, further comprising a third pad electrode connected to the central portion of the second pad electrode, and on the second touch insulating layer in the input pad area and the output pad area.

18. The display device of claim 13, wherein the cutout portion extends in a second direction crossing the first direction.

19. The display device of claim 13, wherein the cutout portion has a trapezoidal shape in cross-sectional view.

* * * * *